(12) United States Patent
Shim et al.

(10) Patent No.: US 6,844,717 B2
(45) Date of Patent: Jan. 18, 2005

(54) TEST HANDLER

(75) Inventors: Jae-Gyun Shim, Suwon (KR); Seung-Won Jeon, Suwon (KR); Yun-Sung Na, Cheonan (KR); In-Gu Jeon, Seoul (KR)

(73) Assignee: Techwing Co., Ltd. (KR)

( * ) Notice: Subject to any disclaimer, the term of this patent is extended or adjusted under 35 U.S.C. 154(b) by 517 days.

(21) Appl. No.: 09/975,861

(22) Filed: Oct. 12, 2001

(65) Prior Publication Data

US 2003/0085160 A1 May 8, 2003

(51) Int. Cl.⁷ .............................................. G01R 31/26
(52) U.S. Cl. .................................................. 324/158.1
(58) Field of Search .............................. 324/158.1, 760, 324/765; 165/80.2; 414/935–941; 73/865.6, 866.5

*Primary Examiner*—Evan Pert
(74) *Attorney, Agent, or Firm*—Cantor Colburn LLP

(57) ABSTRACT

The present invention discloses a test handler comprising a main body, a stocker including a user tray supplier and a user tray deliverer for loading plurality of user trays carrying the semiconductor device during devices tests, a plurality of test trays, a device loading means for transferring the devices in the user tray of the user tray supplier to the test tray, a first tray inverter changing the horizontal posture of the test tray, a soak chamber preparing a desired test temperature condition, a test chamber accomplishing tests, a de-soak chamber restoring the devices temperature, a second tray inverter inverting to the test tray of a horizontal posture, a device unloading means transferring the semiconductor devices on the test tray. The present invention can double the lot size in unit operation to improve equipment operation ratio. In more, the device loading time and unloading can be reduced so that the number of the devices treated in unit operation can be increased.

19 Claims, 20 Drawing Sheets

TEST HANDLER

BACKGROUND OF THE INVENTION

1. Field of the Invention

The present invention is related to a test handler, and more particularly, to a test handler for testing an electric component (in this application, a 'device' is designated for an electric component in the following statements) such as an integrated circuit (IC) or a semiconductor chip.

2. Description of the Related Art

The device manufactured through a predetermined assembly process in a semiconductor manufacturing process, should perform a test process for checking whether a predetermined function in the device is operated or not. A test handler is employed in such a test process, and the test process is accomplished by transferring a predetermined number of the devices and by contacting a test head to the devices. According to the test results, the devices are classified and transferred.

Such a test handler transfers the 32 or 64 devices to the test head for testing simultaneously, and performs a test in the abnormal temperature surroundings, such as the high or the low temperature.

As illustrated in FIG. 1 and FIG. 2, the conventional test handler comprises a user tray supplier 10 for loading multiple user trays carrying the testable devices, and a user tray deliverer 20 for loading multiple user trays carrying the classified devices after completing the test, in the front side of a handler main body 1.

Additionally, in the upper portions of the user tray supplier 10 and the user tray deliverer 20, a loading side set plate 30 and an unloading side set plate 40 are placed for loading and unloading the devices respectively.

A user tray loaded in the user tray supplier 10 is sequentially transferred to the loading side set plate 30 by a transfer arm (not shown), and the user tray placed in the unloading side set plate 40 is also sequentially transferred to the user tray deliverer 20 by the above mentioned transfer arm.

Additionally, the handler main body 1 comprises a soak chamber 50 and a de-soak chamber 60 in both the back sides of the handler main body 1, and a test chamber (not shown) between those chambers 50 and 60 in the bottom side of the handler main body 1.

In more, as illustrated in FIG. 2, the handler main body 1 comprises first, second and third tray arrangement stations 80, 81 and 82 placing a test tray 70 in the upper side of the test chamber. The test tray 70 circulates from the first tray arrangement station 80 to the second tray arrangement station 81 through the soak chamber 50, two test chambers, the de-soak chamber, the third tray arrangement station 82 sequentially.

In more, in the upper side of the handler main body 1, the test handler comprises a vertical loading robot 90 and two vertical unloading robots 91 and 92. The vertical loading robot 90 picks the devices from the user tray placed at the loading side set plate 30, and transfers the devices to the test tray 70 placed at the first tray arrangement station 80. In a similar way, two vertical unloading robots 91 and 92 pick the devices from the test tray 70 placed at the second and the third tray arrangement station 81 and 82, and transfer the devices to the user tray placed at the unloading side set plate 40.

The soak chamber 50 heats or cools the devices in the test tray 70 to a predetermined temperature, and vertically lifts down the test tray 70 to the test chamber. The test chamber maintains surroundings of a predetermined temperature and connects to test heads 100 and 101 to test the devices. A first test chamber performs tests for 32 devices and a second test chamber performs tests for the other 32 devices.

The de-soak chamber 60, restoring the heated or the cooled devices to a room temperature devices, lifts vertically up the test tray 70 on the contrary to the soak chamber 50 and supplied the test tray 70 to the third arrangement station 82.

Additionally, the vertical robots 90, 91 and 92 comprise a plurality of hands for receiving the devices using a suction function and move continuously and repeatedly between the user tray and the test tray 70 while being operated by a servomotor and a timing belt. By this moving, the devices are transferred from the user tray to the test tray 70 or from the test tray 70 to the user tray.

On the other hand, though not shown in the accompanying drawings, a main controller of the test handler includes a conveyor device for circulating the test tray 70 among a loading area, a soaker area, a test area and an unloading area, and a control circuit for controlling drivers of the circulation and those devices.

In the conventional test handler described as the above statements, as illustrated in FIG. 3, one user tray loaded in the user tray supplier 10 by a transfer arm is transferred to the loading side set plate 30.

After the vertical loading robot 90 performs pre-sizing operations so that the position of the devices in a pre-sizing unit 31 exactly corresponds to the position of the socket within the test tray 70, the multiple devices are transferred to the test tray 70 placed in the first tray arrangement station 80 (Step 1).

After the test tray 70 containing the multiple devices is transferred to the soak chamber 50 and is heated up or cooled down to the temperature of the test conditions while lifting down, the test tray is transferred to the test chamber (Step 2 and Step 3).

In the test chamber, tests are progressed after the multiple devices on the test tray 70 connect to the sockets of the test heads 100 and 101 (Step 4). The test tray 70 completing the tests is transferred to the de-soak chamber 60.

The test tray 70 restoring the room temperature (Step 5) while passing the de-soak chamber 60, is transferred to the second and the third tray arrangement stations 81 and 82. In the second and the third tray arrangement stations 81 and 82, each of the devices is classified according to the test results by the two vertical unloading robots 91 and 92, and transferred to an empty tray placed at the unloading side set plate 40. (Step 6 and Step 6')

After the empty tray in the unloading set plate 40 is filled with the devices, the empty tray is transferred and loaded to the user tray deliverer 20 according to the classification by the transfer arm. After that, the transfer arm transfers new empty tray to the unloading side set plate 40, and the above operation is repeated until the inspection for the one lot of the devices is completed.

However, in the conventional test handler described in the above statements, as shown in the operation flow of the test tray 70 of FIG. 3, the tests for the 64 devices contained in a single test tray 70 are only completed in the case that the test tray 70 should be transferred in a single line and passed the first and the second test chamber serially. Therefore, it has disadvantage in that the indexing time of the test tray 70 is long and the number of the devices in a unit time is not so many.

In other words, the conventional test handler requires much time in loading the devices on the user tray to the test tray 70. The conventional test handler also requires more time in unloading the devices on the test tray 70 to the user tray because the vertical unloading robots 91 and 92 perform unloading and sorting the devices simultaneously. Therefore, the amount of the devices treated in a unit time is not so many.

Additionally, because the conventional test handler has a structure that the test tray 70 is transferred horizontally to the handler main body 1 to dock with the test heads 100 and 101, the path for an entrance and an exit of the test heads 100 and 101 should be established within the handler main body 1. Therefore, it has another disadvantage that the size of the handler becomes larger inefficiently.

In more, the test heads 100 and 101 in the conventional test handler are extremely limited because of the horizontal docking structure between the test tray 70 and the test heads 100 and 101. Additionally, the space for another components, for example, the user tray supplier 10 or the user tray deliverer 20, is so limited that lots of the user tray can not be loaded. Therefore, the size of the lot in an operation is limited so that the equipment operation ratio is declined.

SUMMARY OF THE INVENTION

To overcome the above described problems, preferred embodiments of the present invention provide a test handler that employs not only two lined simultaneous transfer system in the test tray, but also an vertical docking structure in the test head to reduce an indexing time for the test tray.

Another purpose of the present invention is to provide a test handler that performs tests by contacting two test trays with a single head simultaneously so that the amount of the devices treated in a unit time in the test handler according to the present invention can be doubled.

Another purpose of the present invention is to provide a test handler that reduces the devices loading time. It can be accomplished by improving a hand structure of a vertical loading robot through the way of picking up 16 devices in a single operation.

Another purpose of the present invention is to provide a test handler that reduces the devices loading time. It can be accomplished by improving structures of the test tray and of the site decision unit to remove the pre-sizing operations for the devices.

Another purpose of the present invention is to provide a test handler that increases the number of the devices treated in a time by reducing the devices unloading time by dividing the device unloading step into two steps of sorting and unloading.

Another purpose of the present invention is to provide a test handler that reduces an operation time for checking the initial tray loading stairs by installing respectively two sensors to each of two hand units.

Another purpose of the present invention is to provide a test handler that reduces the size of the appearance of the test handler. It is accomplished by the way that the test handler employs two lines simultaneously in the test tray of the vertical docking structure of the test head so that the space for entrance and exit of the test head within the main body of the test handler is not necessary.

Another purpose of the present invention is to provide a test handler that can combine with various kinds of test heads by simple change such as the change kit. It can be accomplished by the way that the test head is placed in the outside of the handler main body to dock the test tray.

Another purpose of the present invention is to provide a test handler that improves an equipment operation ratio. It is accomplished by the way of constituting the user tray supplier and the user tray deliverer into two stairs of the top unit and the bottom unit. Therefore, more numerous user trays can be loaded, the lot size in a single operation is doubled, and the lot size can be extended unlimitedly because the bottom tray can load and unload without stopping the main body.

Another purpose of the present invention is to provide a test handler that can multiply the kinds of devices completing the test and the classification, loaded to the tray, from 5 to 11.

Another purpose of the present invention is to provide a test handler that can repair problems in the test chamber and the wires without separation of the test head. It is accomplished by the way of isolating the de-soak chamber.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFFERED EMBODIMENTS

Figure 1:
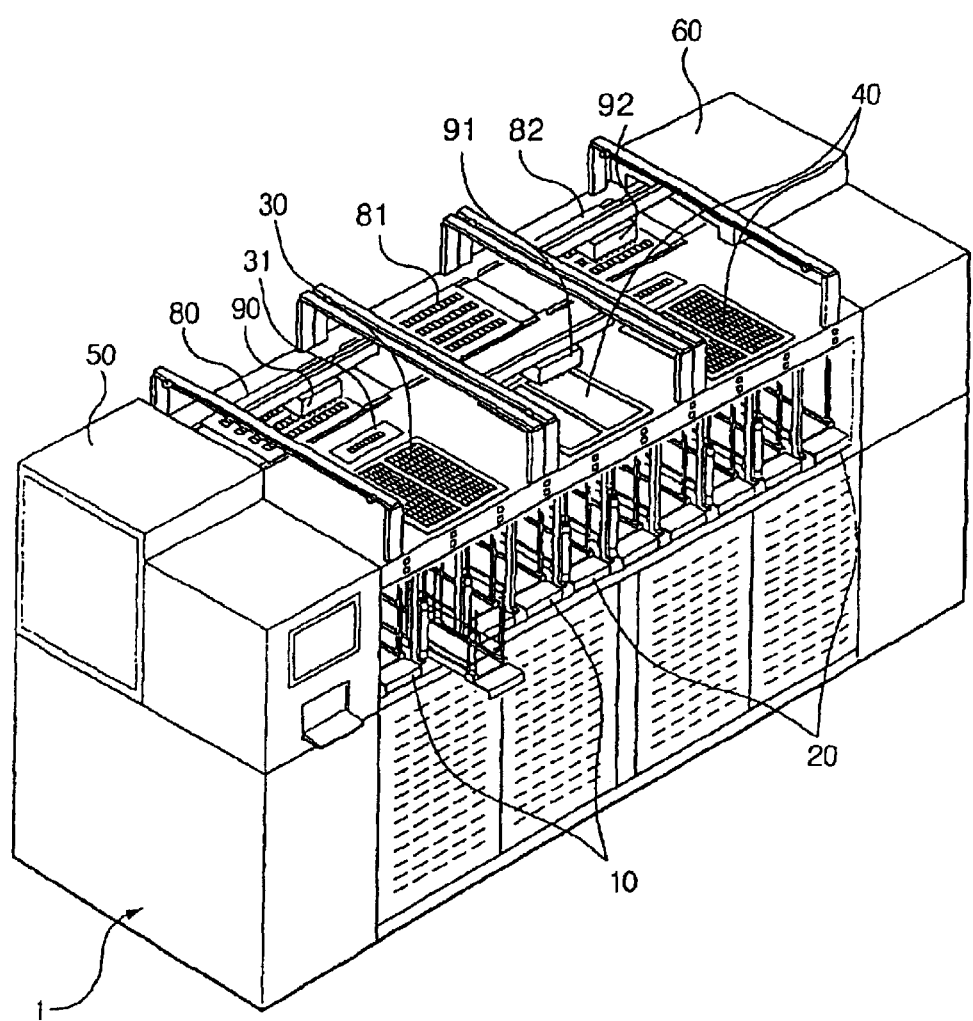
FIG. 1 is a perspective view showing the out-lined conventional test handler.
Figure 2:
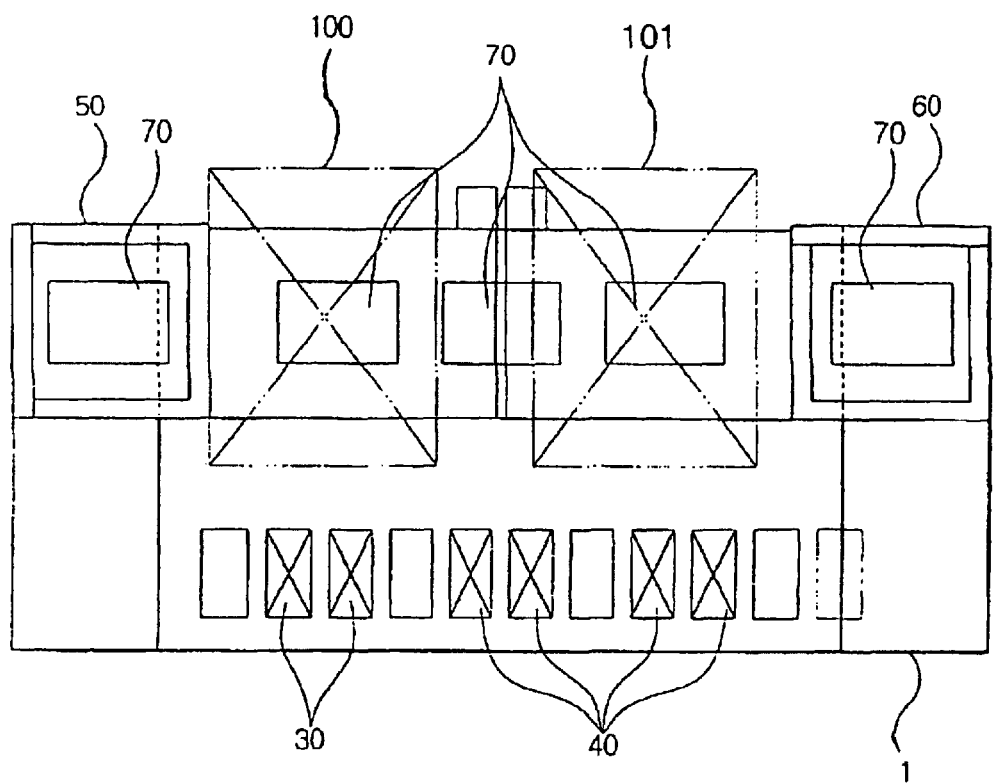
FIG. 2 is a plan view illustrating the chamber arrangement in the test handler in FIG. 1.
Figure 3:
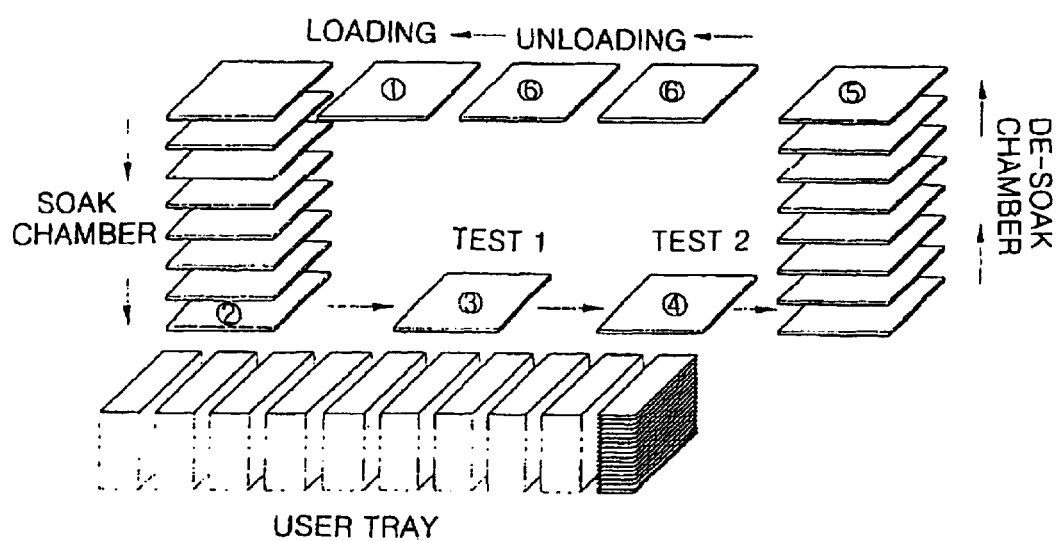
FIG. 3 is an operation flow chart of the test tray illustrating the functions of the conventional test handler.

To accomplish the above described objects, the present invention provides a test handler for transferring more than one semiconductor device to connect to a test head for testing the semiconductor device and for classifying the semiconductor device according to the test results. The test handler comprises a main body, a stocker, a plurality of test trays, a device loading means, a first tray inverter, a soak chamber, a test chamber, a de-soak chamber, a second tray inverter, and a device unloading means. The stocker, prepared within the main body, includes a user tray supplier for loading a plurality of user trays supplying a predetermined amount of the semiconductor devices for a test and a user tray deliverer loading a plurality of user trays carrying the classified semiconductor device according to the test results. The plurality of test trays are arranged according to the moving direction for testing the semiconductor device. The device loading means transfers the semiconductor device in the user tray of the user tray supplier to the test tray. The first tray inverter changes the horizontal posture of the test tray carrying the semiconductor device to the vertical direction. The soak chamber prepares a desired test temperature condition, while receiving sequentially the test tray postured in vertical by the first tray inverter and transferring the test tray to a predetermined step, and discharges the test trays arranged in two vertical row. The test chamber accomplishes tests while connecting the semiconductor devices in the two test trays discharged from the soak chamber, and maintains the test temperature condition. The de-soak chamber restores the devices temperature while arranging the test trays discharged in two rows from the test chamber to a single row. The second tray inverter inverts the test tray discharged in vertical posture from the de-soak chamber to the test tray of a horizontal posture. The device unloading means transfers the semiconductor devices on the test tray postured horizontally by the second tray inverter to multiple empty user trays after classifying the semiconductor devices according to the test results.

According to the present invention, the stocker comprises a multi loader for classifying and storing a plurality of user trays.

According to the present invention, the multi loader comprises a motor, a ball screw rotated by the motor, and a plurality of loader blocks lifting up and down by the ball screw and loading the classified user trays.

According to the present invention, the multi loader further comprises a discharge cylinder discharging the loader blocks to the outside of the test handler, and a transfer guide guiding the discharge of the loader blocks to the outside of the test handler by driving of the discharge cylinder.

According to the present invention, the stocker performs the supply and the deliver of the user tray while test operation, and comprises an auxiliary supplier and an auxiliary deliverer. The auxiliary supplier, equipped in the bottom side of the user tray supplier, loads the user trays to the user tray supplier in the case that the user tray supplier completes to load the user trays within the user tray supplier, and the auxiliary deliverer, equipped in the bottom side of the user tray deliverer, transfers the user tray of the user tray deliverer in the case that the user tray is loaded to the user tray deliverer.

According to the present invention, the device loading means arranged in the upper side of the user tray supplier comprises several loading side set plates including the user tray for loading the devices and a transfer arm transferring sequentially the user tray from the user tray supplier to the loading side set plate. In more, a loading orthogonal robot moves sequentially and repeatedly between the loading side set plate and the loading side tray arranging station placing the test tray, and transfers the semiconductor devices on the user tray to the test tray.

According to the present invention, the device loading means comprises a site decision pin, inserted into a fixing hole equipped movably to the test tray, to fix the insert to the test tray, and a site decision unit including the site decision pin comprising a guide wall, inner-tapered in every directions, to guide the device to the insert.

According to the present invention, the transfer arm comprises a first sensor and a second sensor installed in the upper side of the transfer arm, moves in a predetermined speed until the first sensor detects the position of the user tray, and moves slower than the predetermined speed for the second sensor to detect the user tray in the case that the first sensor detects the position of the user tray.

According to the present invention, the loading orthogonal robot comprises a front row and a rear row equipping 8 vacuum pads respectively to pick up 16 devices in unit operation, a hand adjusting an interval between each of the vacuum pads, and a transfer means driving the hand.

According to the present invention, the transfer means comprises a front and rear transfer (FR transfer) shifting the front row and the rear row in forward or backward direction to adjust an interval between the front row and the rear row, and a left and right transfer (LR transfer) lifting up and down the vacuum pads to adjust an interval of each of the vacuum pads respectively.

According to the present invention, the LR transfer comprises a cam plate including a long hole to fit with a horizontal distance that each of the vacuum pads moves respectively, and a cam follower in each of the vacuum pads is inserted into the long hole of the cam plate to adjust an interval of the vacuum pads, while the cam plate lifts up and down.

According to the present invention, the soak chamber comprises a guide bar loading the test tray of two vertical rows, top and bottom, and a pusher transferring the test tray of two vertical rows loaded in the guide bar to a test position or a discharge position selectively.

According to the present invention, the test head is placed in the outside of the main body.

According to the present invention, the test chamber comprises an air inlet receiving an air from the outside of the test chamber, and a plurality of discharge holes discharging the received air from the air inlet to a side of the test chamber, and a matching plate comprising multiple penetration holes, generated in the side of the test chamber including the discharge holes, for supplying the discharged air from the discharge holes to the devices of the test tray.

According to the present invention, a linear guide is equipped in the bottom side of the de-soak chamber, a linear block is equipped in the main body so that the de-soak chamber can be extracted to the outside of the main body by combining with the linear guide.

According to the present invention, the device unloading means comprises a first and second robots transferring the devices on the test tray placed in the unloading side tray arranging station after classifying the devices according to the test results, at least more than two sorter tables for storing the devices transferred by the first and second robots according to a unit amount and a decided class of the devices, an unloading side orthogonal robot transferring the devices stored in the sorter tables to a predetermined position according to a unit amount and a decided class of the devices, a plurality of unloading side set plates arranged in the upper side of the user tray deliverer including a plurality of empty user trays for receiving the devices transferred by the unloading side orthogonal robot, and a transfer arm transferring the empty user trays to the user tray deliverer in the case that the empty user trays placed in the unloading side set plate are filled with a predetermined amount of the devices.

According to the present invention, the first tray and the second tray inverter comprise respectively a inverting plate including an insert hole in the middle part for the test tray to be admitted, a lifting cylinder combined with the end of a side of the inverting plate, a bracket protruded from the bottom side of the inverting plate including a long hole in every direction, and a front/rear cylinder including a supporting axis combined with the end side of the bracket to push the inverting plate to the forward direction.

According to the present invention, the inside of the insert hole comprises a locking pin locking the test tray inserted in the insert hole, and a locking cylinder operating the locking pin.

According to the present invention, the device unloading means comprises a sorting part for sorting the devices according to the test results, and an unloading part for unloading the sorted devices from the sorting part.

Reference will now be made in detail to preferred embodiments of the present invention, example of which is illustrated in the accompanying drawings.

Figure 5:
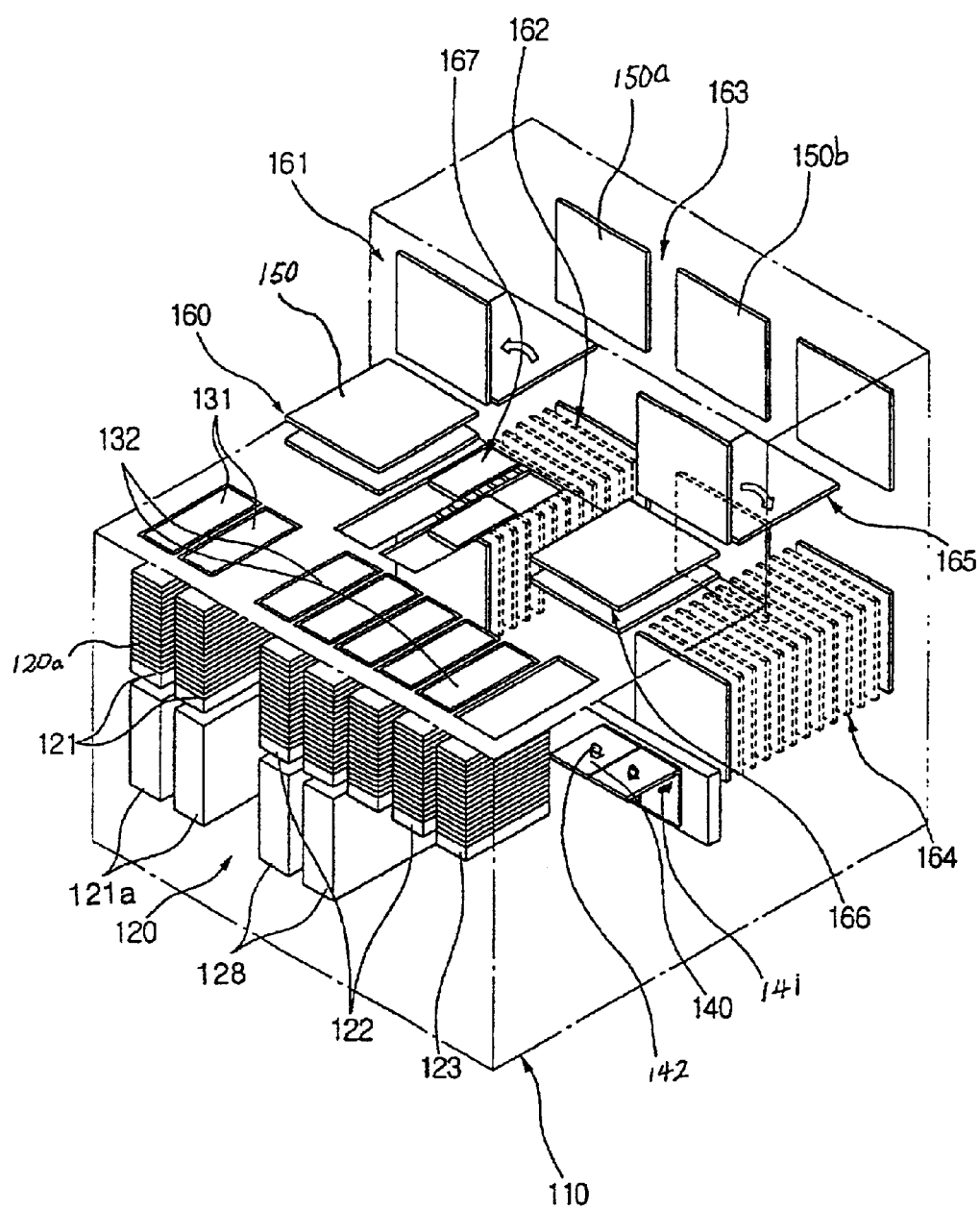
FIG. 5 is a perspective view showing the test handler related to the operation flow of the test tray according to the present invention.

As illustrated in FIG. 5, a stocker 120 is arranged in the front side of the handler main body 110. The stocker 120 comprises a user tray supplier 121 loading a plurality of user trays 120a for carrying the testable devices, a user tray deliverer 122 loading a plurality of user trays 120a for carrying the devices sorted in the class after testing the devices, and a multi loader 123 storing various kinds of the classified user trays 120a.

The user tray supplier 121 can comprise two or three tray loaders and the user tray deliverer 122 can comprise 11 to 12 trays according to the classification.

Additionally, an auxiliary supplier 121a is arranged in the bottom side of the user tray supplier 121. When the user tray supplier 121 completes to load all of the user tray 102a in the user tray supplier 121, the auxiliary supplier 121a always supplies new user tray so that it does not necessary to stop the operation of the handler main body 110 in order to supply the user tray 120a again.

Figure 6:
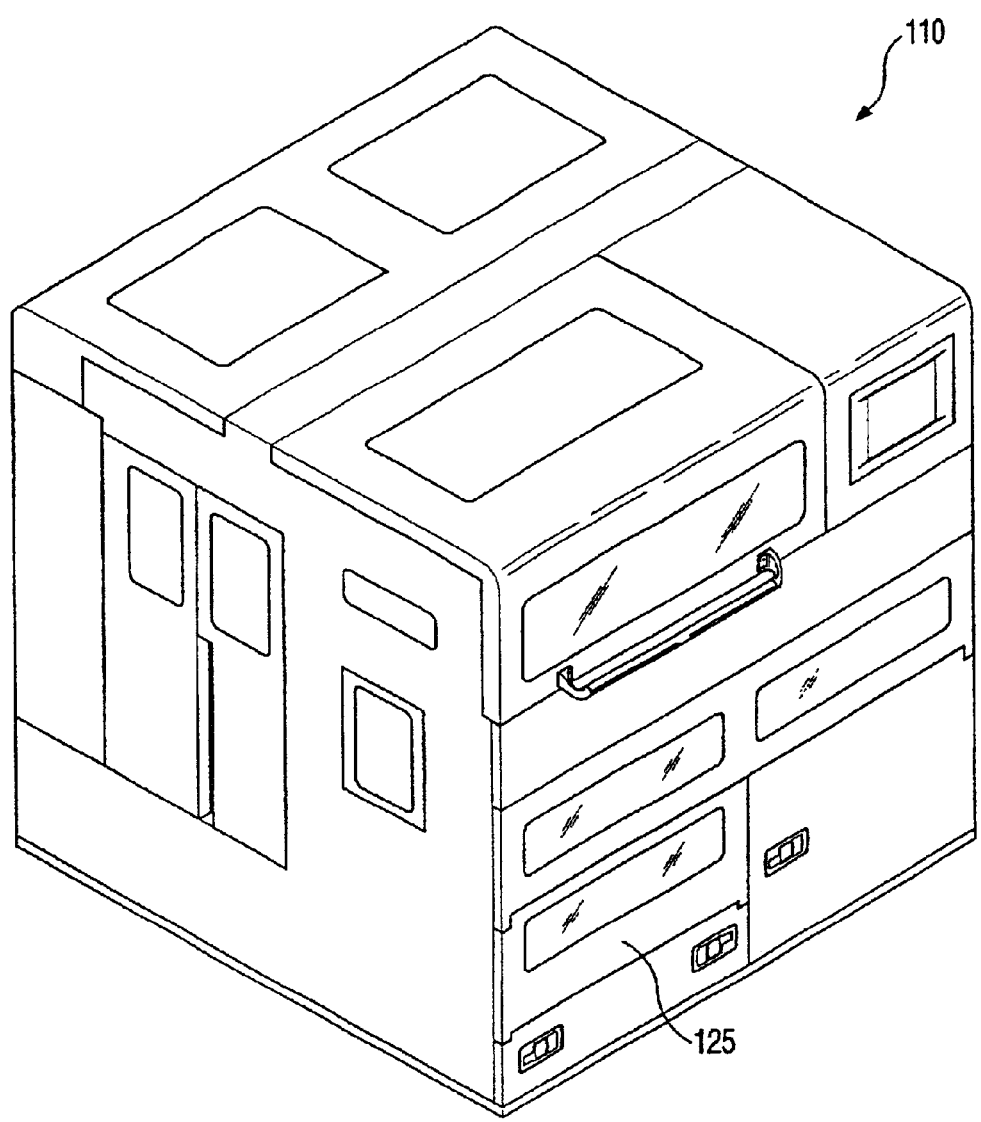
FIG. 6 is a perspective view illustrating an appearance of the test handler according to the present invention.
Figure 7:
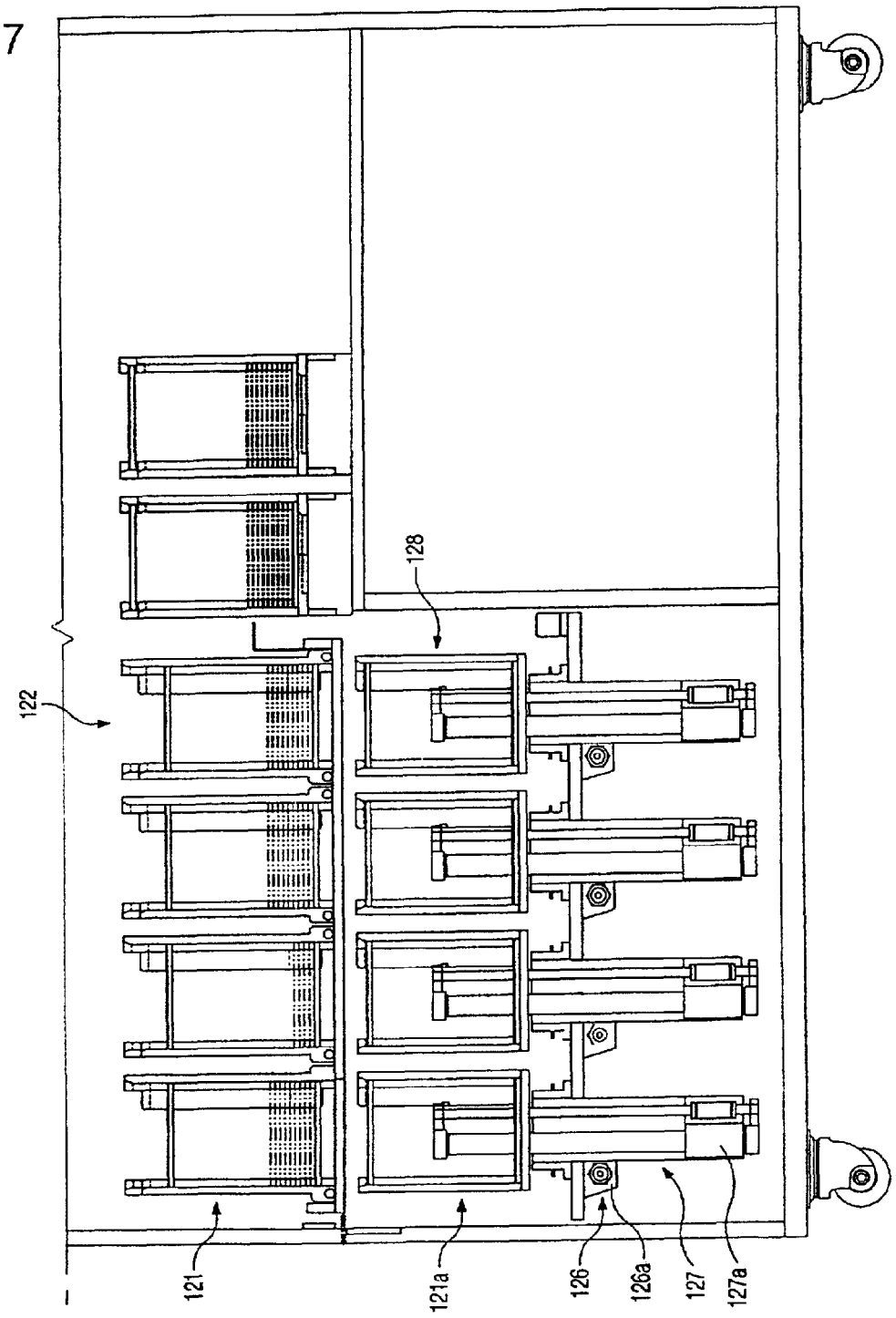
FIG. 7 is a front view showing a stocker of the test handler according to the present invention.

In other words, as illustrated in FIG. 6, the auxiliary door 125 is installed in the front bottom side of the handler main body 110 and the auxiliary door 125 is automatically opened by pushing a button. As illustrated in FIG. 7, a front side transfer 126 equipping an admission cylinder 126a drives the auxiliary supplier 121a to the front side of the handler main body 110 so that an operator can load the user tray 120a easily. After loading the user tray 120a, the auxiliary supplier 121a returns to the original position.

In this case, when the user tray supplier 121 completes to load all of the user trays 120a, the auxiliary supplier 121a lifts up the user trays 120a to load to the user tray supplier 121 by a lift transfer 127 equipping an elevating cylinder 127a.

In a similar way, an auxiliary deliverer 128 is included in the bottom side of the user tray deliverer 127 in the same structure of the auxiliary supplier 121a so that the user tray 120a loaded in the user tray deliverer 122 is delivered at any time by lifting down the auxiliary deliverer 128 without stopping the main body 110. Therefore, the equipment operation ratio can be improved because the lot size operated in a time can be doubled or more without any limit.

Figure 4:
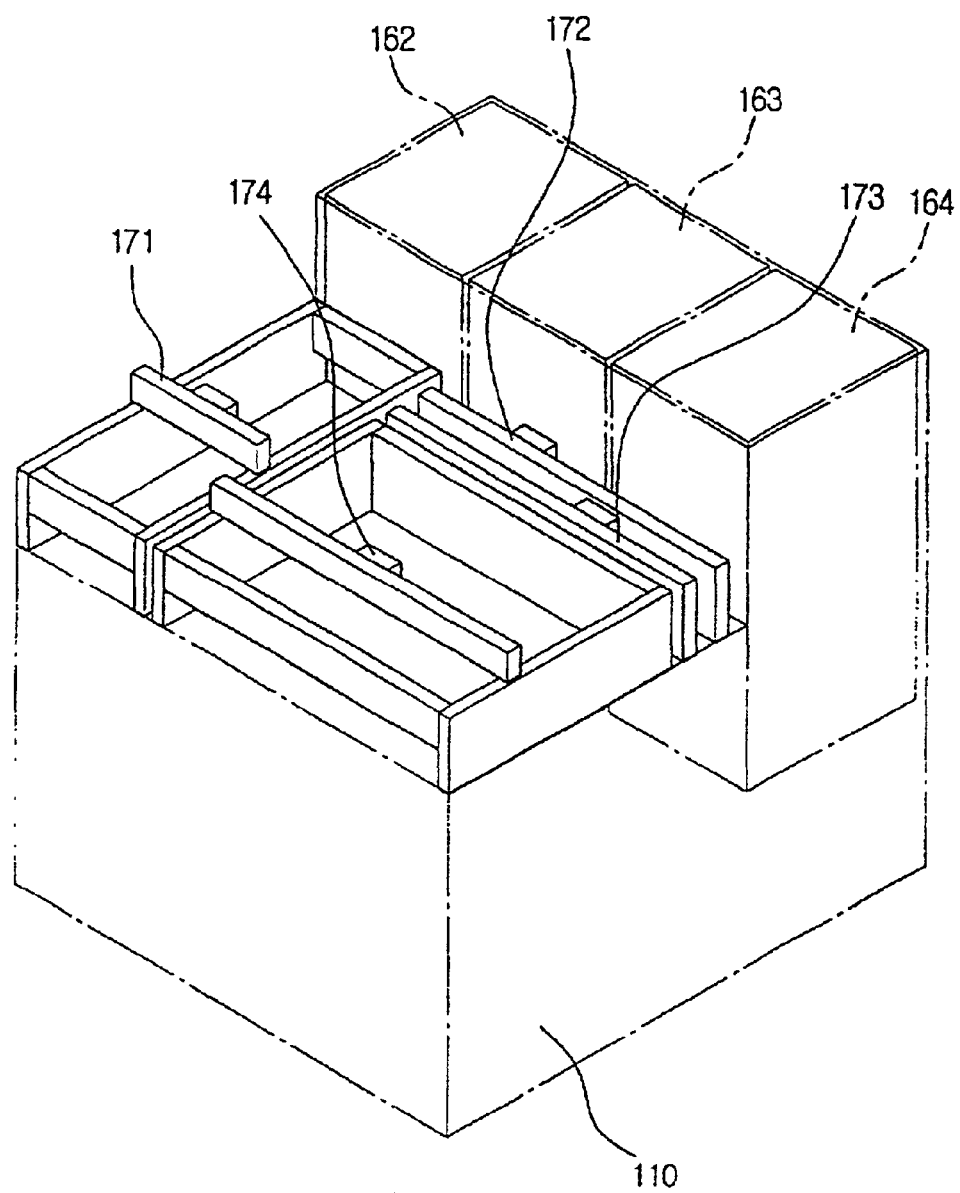
FIG. 4 is a perspective view illustrating an arrangement of a loading, an unloading, and vertical sorting robots of a test handler according to the present invention.
Figure 8:
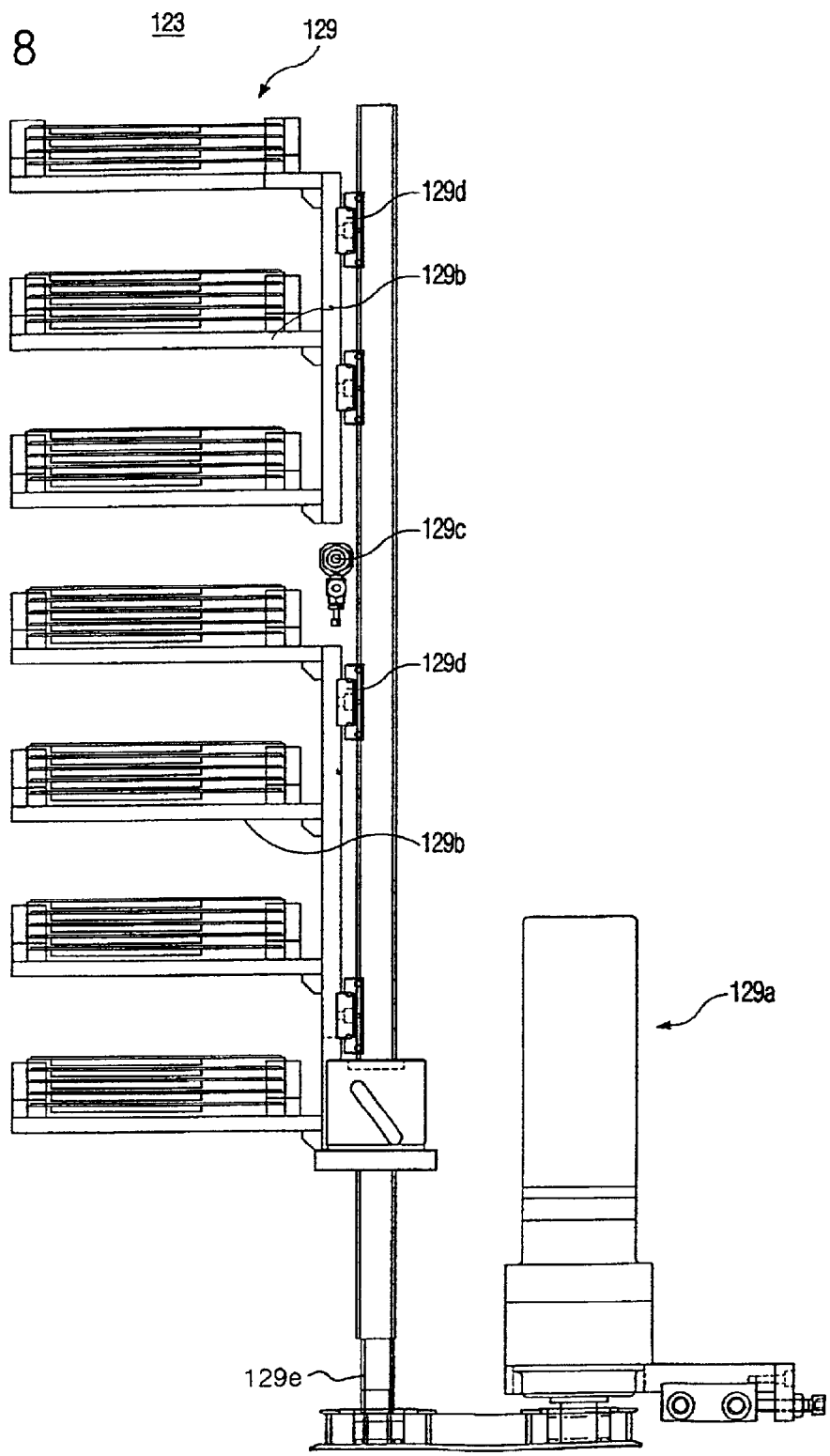
FIG. 8 is a front view showing the multi loader of the test handler according to the present invention.

In more, as illustrated in FIG. 4, the multi loader 123 is equipped in the side of the stocker 120. The multi loader 123, as illustrated in FIG. 8, comprises a plurality of loaders 129 storing 7 the user tray 120a in the space of loading a single kind of the user tray 120a. Therefore, the loaders 129 lift up and down by a motor driver 129a equipped in the bottom side of the multi loader 123 and by a ball screw 129e operated by the motor driver 129a, so that the loaders 129 can receive the pre-defined user tray 120a in the desired position. Additionally, 3 or 4 loaders 129 are connected together to constitute a loader block 129b, so that the loader block 129b is delivered to the outside of the main body 110 by a discharge cylinder 129c and a transfer guide 129d, and an operator can extract the user tray 120a easily.

Figure 9:
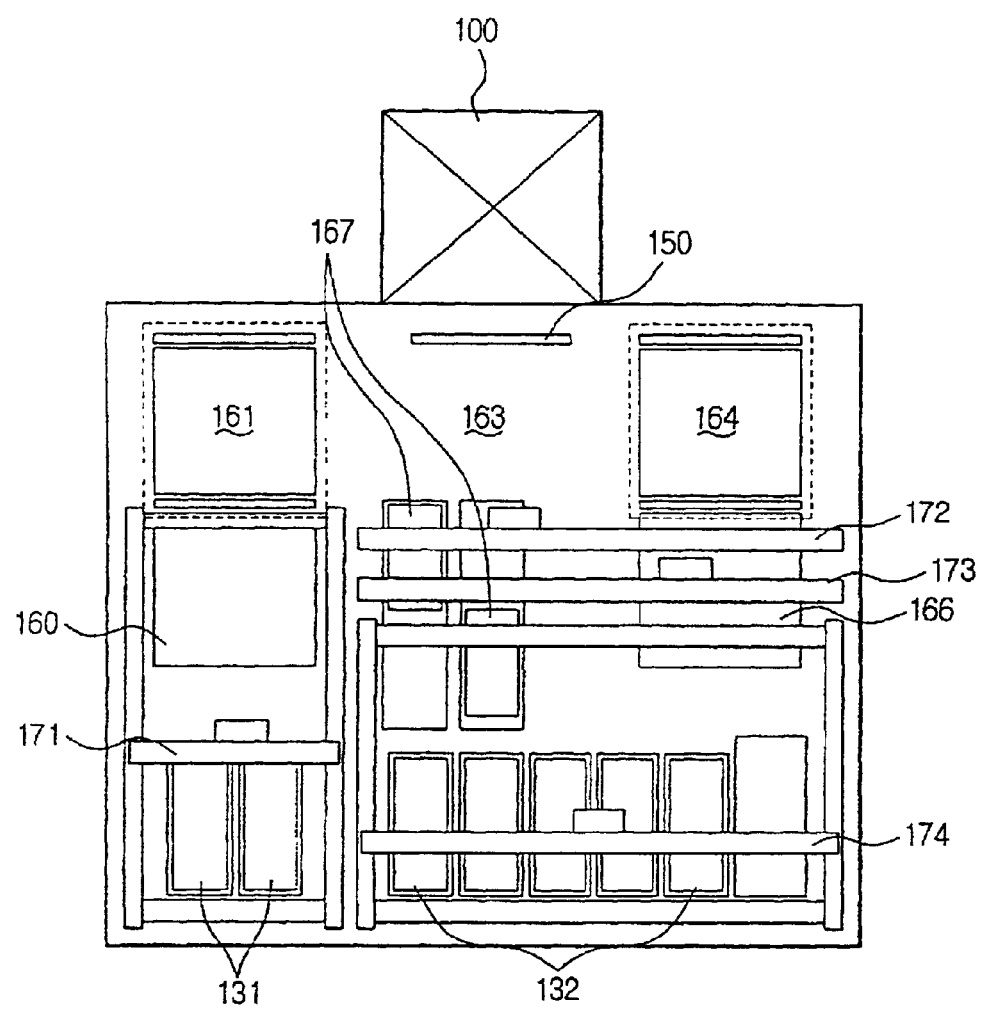
FIG. 9 is a plan view illustrating the chamber arrangement in the test handler according to the present invention.

On the contrary, as illustrated in FIG. 5 and FIG. 9, the test handler according to the present invention comprises several loading side set plates 131 and several unloading side set plates 132 in the upper side of the stocker 120 in the handler main body 110. The loading side set plate 131 is an antechamber of the user tray 120a carrying the testable devices and the unloading side set plate 132 is antechamber of the empty user tray 120a receiving the devices sorted in class after testing.

Accordingly, the user tray 120a carrying the testable devices in the user tray supplier 121 is moved sequentially to the loading side set plate 131 by a transfer arm 140. In other words, the transfer arm 140 recognizes the loading height of the user tray 120a while lifting down the user tray supplier 121, and lifts down fast until a first sensor 141 equipped in the side of the transfer arm 140 detects the position approximately.

When the first sensor 141 detects the position, the transfer arm 140 lifts down slow and picks up the user tray 120a to transfer it to the loading side set plate 131 while a second sensor 142 in the side of the transfer arm 140 detects the user tray 120a. Additionally, the transfer arm 140 transfers the empty user tray to the loaders of the user tray deliverer 122 when the empty user tray placed in the loading side set plate 131 is filled with the devices.

As illustrated in FIG. 5, the test handler according to the present invention comprises a plurality of the test trays 150 moving through the main direction of the test procedure of the handler main body 110. The test tray 150 placed initially in the loading side arranging station 160 receives multiple testable devices. The single test tray 150 contains 64 devices.

On the contrary, as illustrated in FIG. 4 and FIG. 9, the vertical loading robot 171 moves continuously and repeatedly between the loading side set plate 131 and the loading side tray arranging station 160. In more, the vertical loading robot 171 picks up the devices from the user tray 120a placed in the loading side set plate 131 and transfers the devices to the test tray 150. The vertical loading robot 171 comprises a hand 180 picking 16 devices in a single operation.

Figure 10:
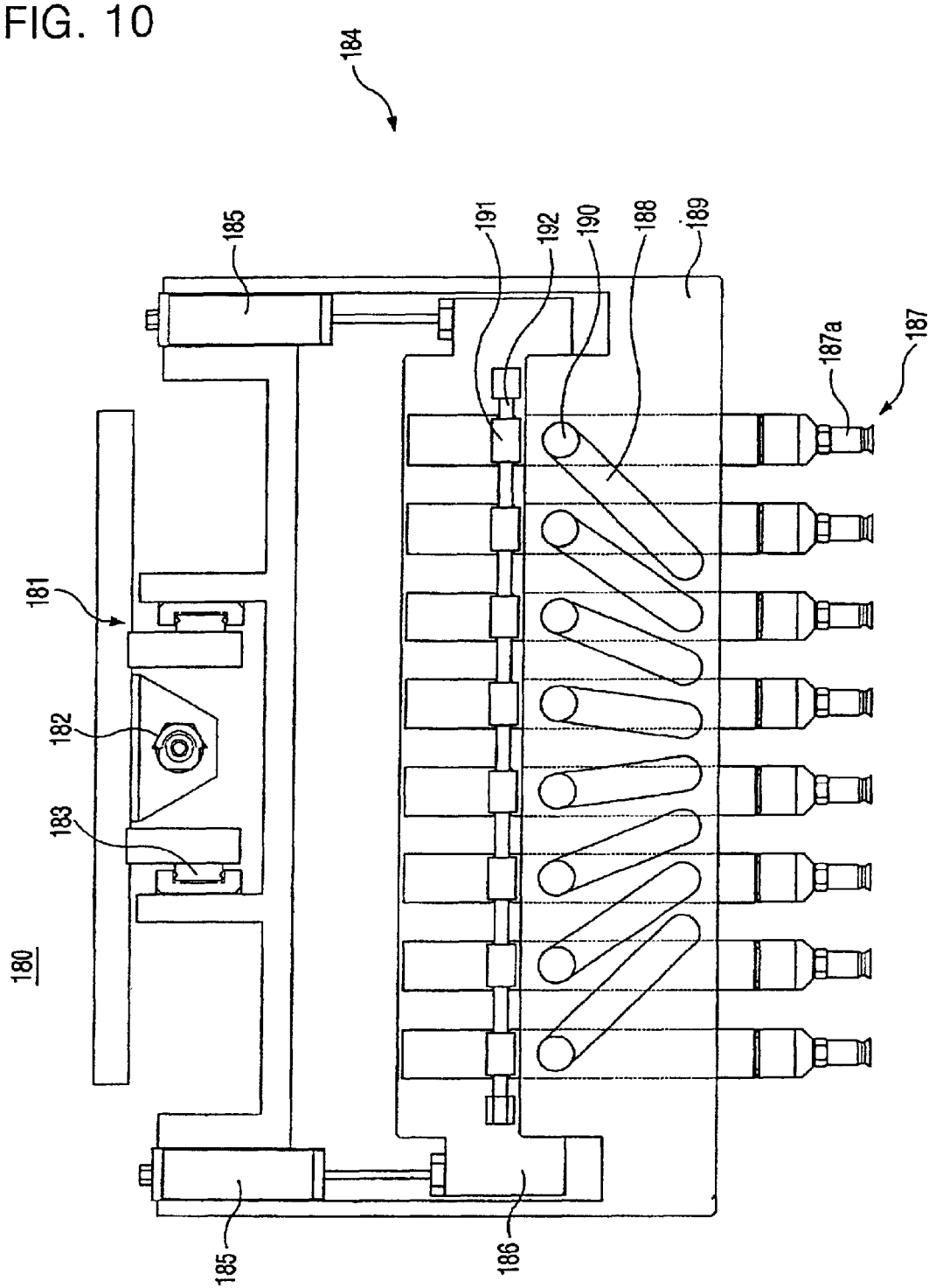
FIG. 10 is a front view showing the hand of the test handler according to the present invention.
Figure 11:
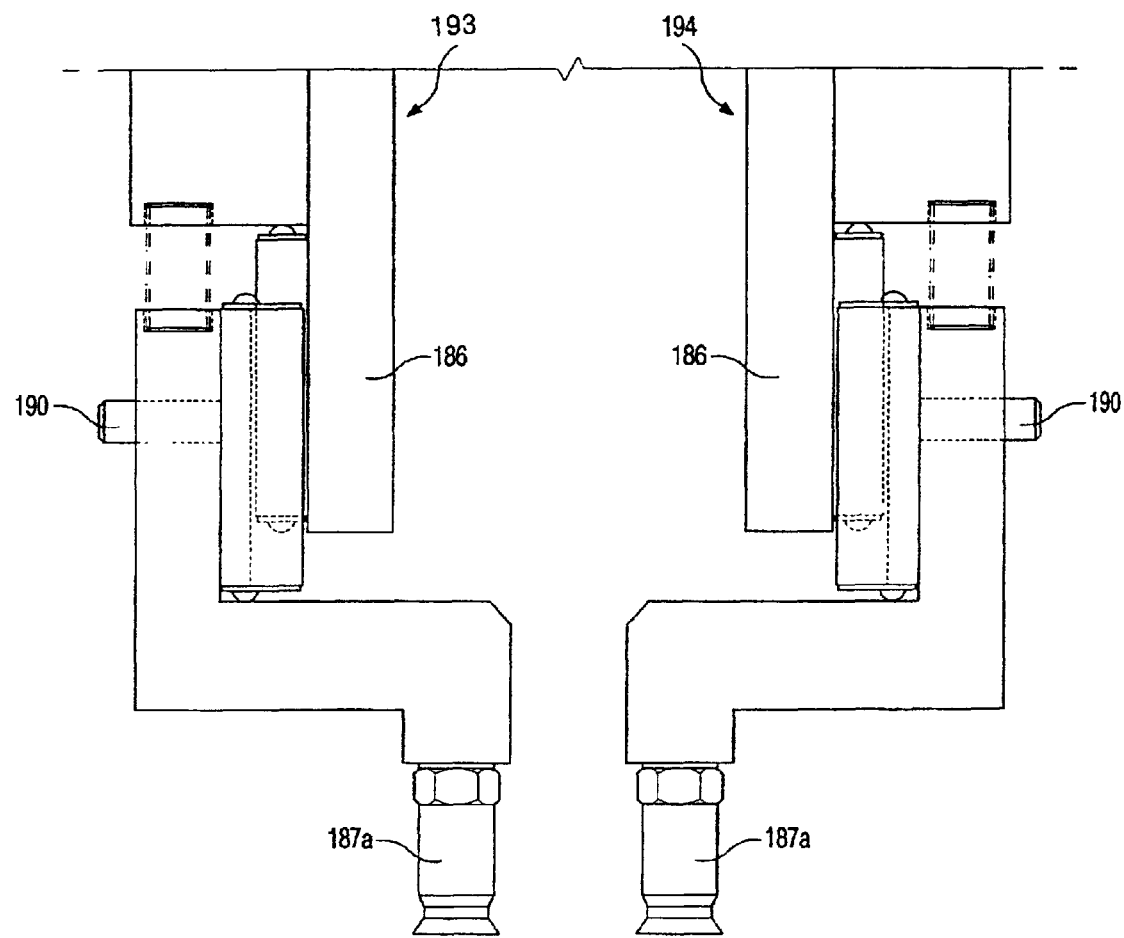
FIG. 11 is a side view showing the hand of the test handler according to the present invention.

As illustrated in FIG. 10 and FIG. 11, the hand 180 comprises 8 vacuum pads 187a in a front row 193, the other 8 vacuum pads 187a in a rear row 194, a front and rear transfer (FR transfer) 181 and a left and right-transfer (LR transfer) 184. The FR transfer 181 transfers the front row 193 and the rear row 194 to adjust the interval between those rows, and a left and right transfer (LR transfer) 184 lifting up and down a cam plate 189 to adjust the interval of each of the vacuum pads 187a respectively.

The FR transfer 181 equips a first cylinder 182 and a first guide rail 183 to transfer the vacuum pads 187a of the front row 193 and of the rear row 194. In more, the LR transfer 184 equips a second cylinder 185 in both side of the LR transfer to lift up and down a plate 186 connected by a horizontal movable pad 187. In the front side of the vacuum pads 187, a cam plate 189 having a long hole 188 is equipped as fitting with the moving horizontal distance and the moving vertical distance of each of the vacuum pads 187a.

At this time, each of the vacuum pads 187a comprises a protruded cam follower 190 inserted into the long hole 188 of the cam plate 189, and a bearing 191 equipped in the upper side of each of the vacuum pads 187a is connected to a horizontal axis 192 penetrating the bearing 191.

Accordingly, when the devices is picked up from the user tray 120a, the interval between the front row 193 and the rear row 194 of the hand 180 becomes narrow, and the vacuum pads 187 lift down so that each of the vacuum pads 187 adheres to the devices. When carrying the devices to the test tray 150 after picking up, the first cylinder 182 of the FR transfer 181 is operated to broaden the interval between the front row 193 and the rear row 194 to fit with the interval of the test tray 150. In this case, the second cylinder 185 of the LR transfer 184 is also operated to broaden the interval of each of the vacuum pads 187a respectively by the way that the long hole 188 of the cam plate 189 guides the cam follower 190 of the vacuum pads 187.

On the contrary, when the devices picked up by the hand 180 are transferred to the test tray 150, the conventional test handler temporarily transfers the devices to the pre-sizing equipments to set the devices in the correct position and re-picks the devices to transfer to the test tray 150.

Figure 12:
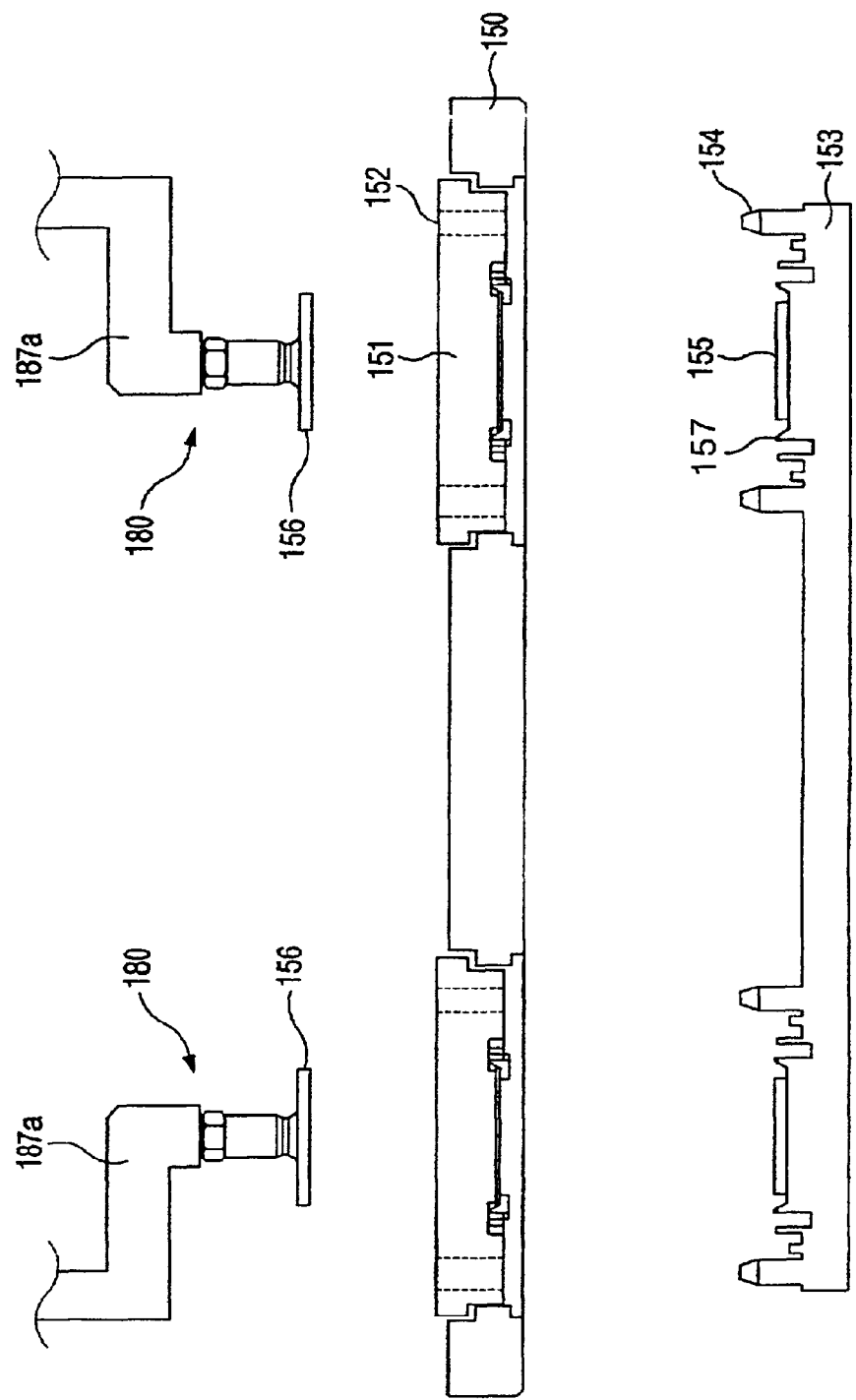
FIG. 12 is a front view illustrating the loading states of the devices to the test tray in the test handler according to the present invention.

However, the test handler according to the present invention transfers the devices to the test tray 150 correctly without the pre-sizing equipment. In other words, as illustrated in FIG. 12, a plurality of movable inserts 151 are equipped in the test tray 150. When the hand 180 picks up the devices to be settled in the test tray 150, the site decision unit 153 in the bottom of the test tray 150 raises up to insert a site decision pin 154 to a fixing hole 152 of the insert 151 and the insert 151 is finally fixed in the correct position.

When a device 156 is inserted into the insert 151, the guide wall 157, inner-tapered in every direction, of the site decision unit 153 guides the device 156 to be correctly settled in the insert 151 even though the devices attached to the hand 180 are dislocated.

As illustrated in FIG. 5 and FIG. 9, the handler main body 110 comprises a first tray inverter 161, a soak chamber 162, a test chamber 163, a de-soak chamber, a second tray inverter 165, an unloading tray arrangement station 166 and a sorter table 167 in the main direction of the test procedure.

The first tray inverter 161 makes the test tray 150 receiving the devices from the loading side tray arranging station 160 to stand up straight, and supplies the vertical test tray 150 to the soak chamber 162.

Figure 19A:
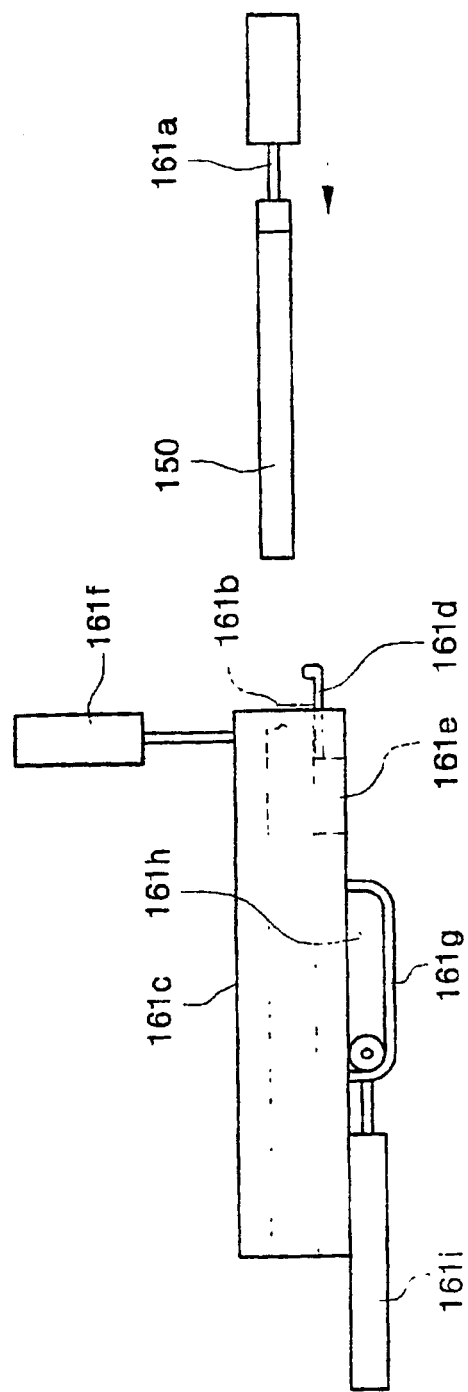
FIG. 19a, FIG. 19b and FIG. 19c illustrate the constitution and the function states of an inverter means of the test handler according to the present invention.
Figure 19B:
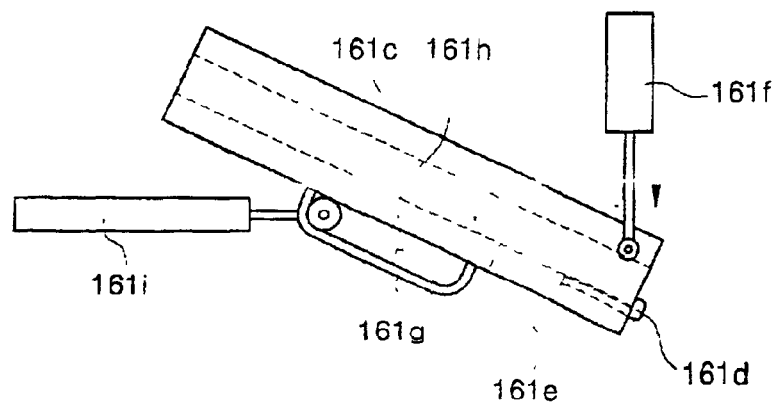
Figure 19C:
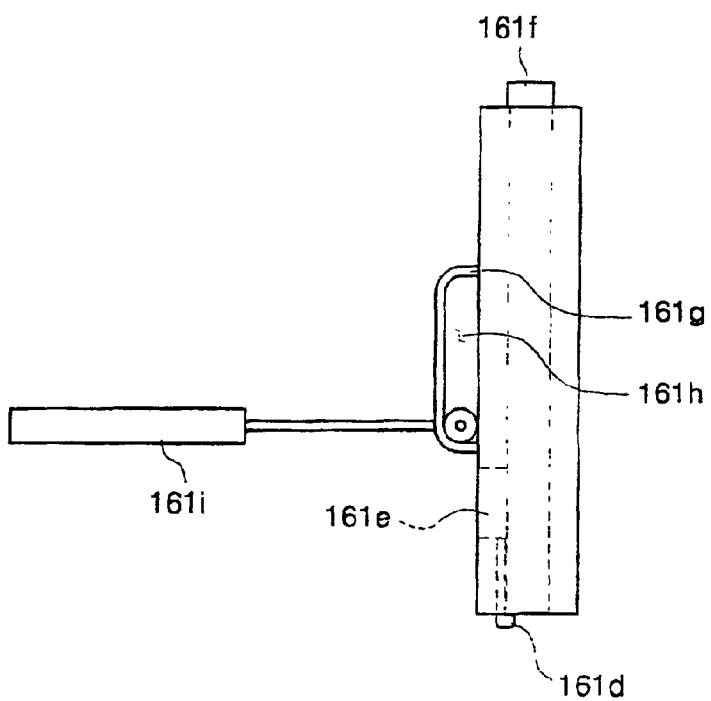

The first tray inverter 161, as illustrated in FIGS. 19a to 19c, comprises an inverting plate 161c, a locking pin 161d, and a locking cylinder 161e. The inverting plate 161c comprises an insert hole 161b in the middle so that the test tray 150 operated by a transfer arm 161a is inserted. The locking pin 161d equipped in the inside of the insert hole 161b locks and supports the test tray 150 inserted into the insert hole 161b. The locking cylinder 161e operates the locking pin 161d.

Additionally, the first tray inverter 161 further comprises a lifting cylinder 161f, a bracket 161g, and a front/rear cylinder 161i. The lifting cylinder 161f is combined with the end of a side of the inverting plate 161c. The bracket 161g protruded in the bottom side of the inverting plate 161c includes a long hole 161h in the forward and backward direction. The front/rear cylinder 161i combined in axis with the bracket 161g pushes the inverting plate 161c to the forward direction The soak chamber 162 receives the test tray 150 in vertical posture by the first tray inverter 161 and moves the test tray 150 through a predetermined step in forward or backward direction to heat up or cool down the devices in the test tray 150 in the test temperature condition. To perform this, a heater for heating up and a cooler for cooling down are equipped in the bottom side of the soak chamber 162 and a cylindrical transfer apparatus for horizontal moving are also equipped.

At this time, because each of the device receiving grooves in the test tray 150 comprises the insert 151 supporting the devices respectively, the devices are not separated from the receiving grooves even though the test tray 150 stands up vertically.

Figure 15:
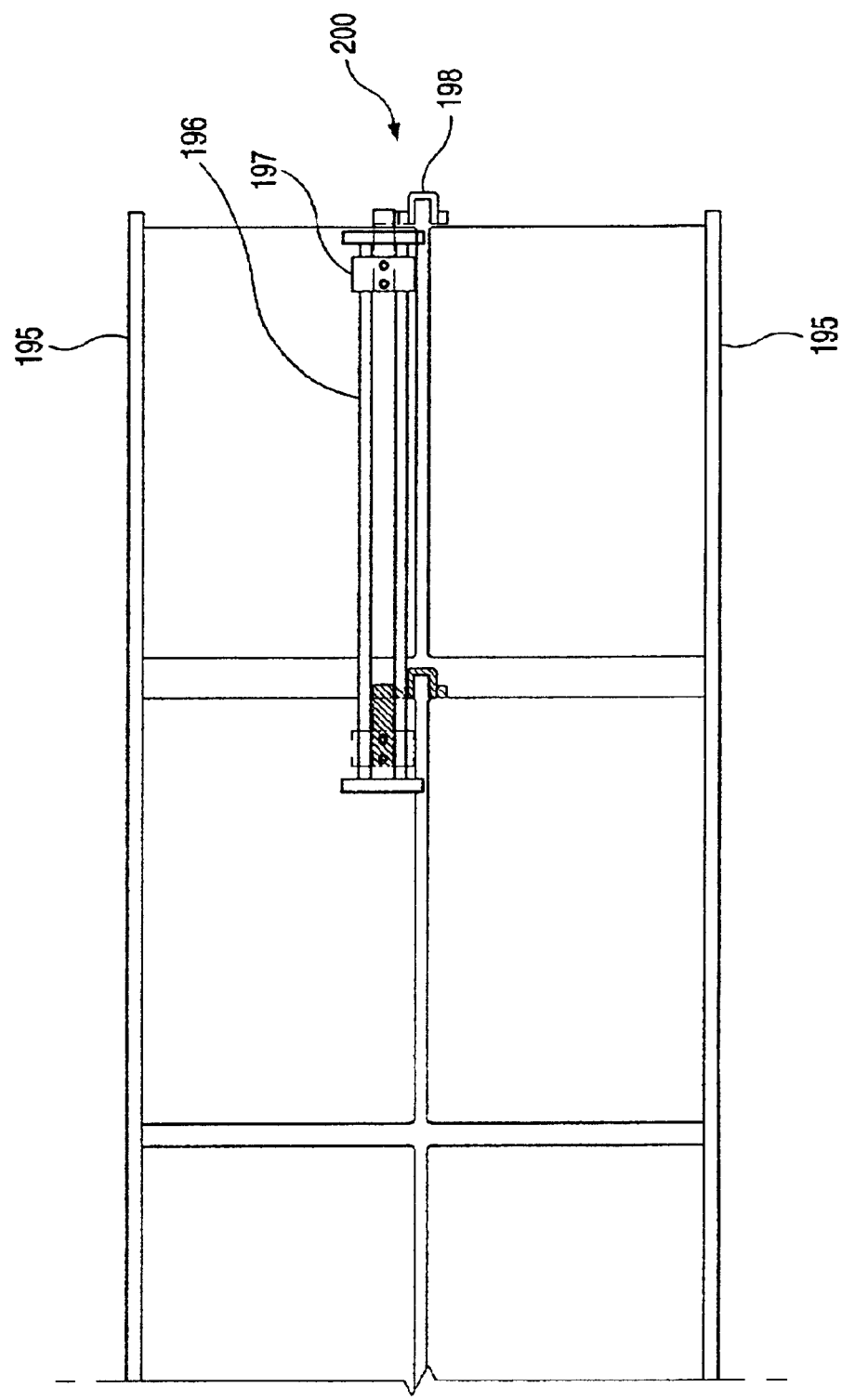
FIG. 15 is a front view illustrating the indexing mechanism of the test handler according to the present invention.
Figure 16:
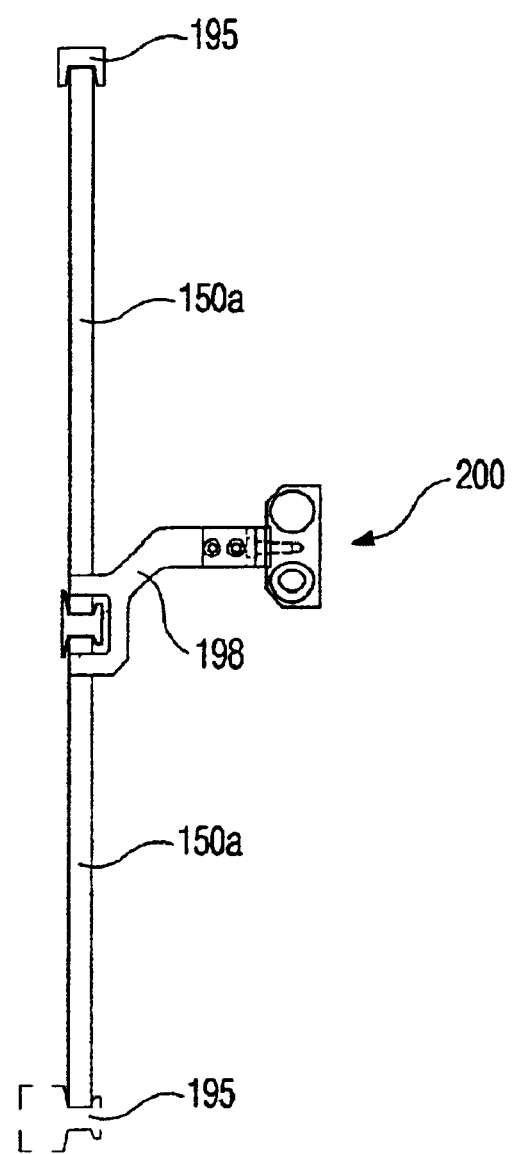
FIG. 16 is a side view illustrating the indexing mechanism of the test handler according to the present invention.

In this case, as illustrated in FIG. 15 and FIG. 16, the test tray 150a discharged from the soak chamber 162 is finally loaded on a guide bar 195 arranged vertically in two top and bottom rows. Sequentially, the test tray 150a is transferred to the test head, while a pusher 198 combined with a transfer axis 196 and a transfer means 197 pushes the test tray 150a included in the top and the bottom tray. The test tray 150a also includes an indexing mechanism 200 discharging the test completed tray 150b.

In comparing with the conventional way re-transferring the test tray 150a in the soak chamber 162 to the test chamber after the test completed tray 150b is discharged, the transferring method according to the present invention reduces the cost and removes causes of equipment disorder by not only reducing the transfer time enormously, but also simplifying the complicated transfer equipment.

The test chamber 163 receives the test tray, having two rows of the top and the bottom, supplied in the state of a vertical arrangement, and maintains the test temperature in heating or in cooling state. In this state, the test chamber 163 performs device tests by connecting the 128 devices in the test tray 150 with the test head 100 (shown in FIG. 9) electrically. In other words, the test head 100 vertically docks the test tray 150, and the tests for 128 devices in a single test operation are simultaneously accomplished.

Figure 18:
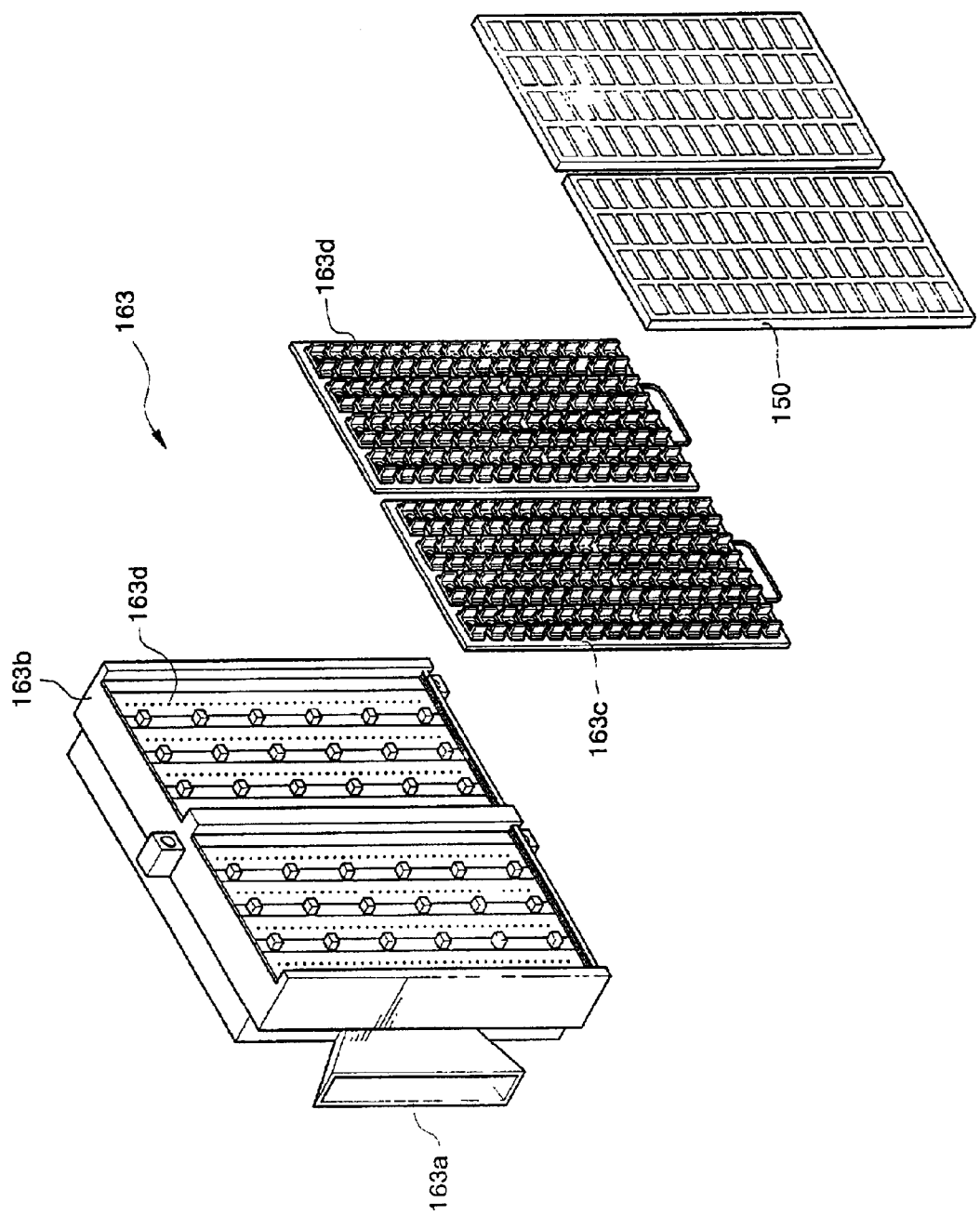
FIG. 18 is a disassembled perspective view illustrating the test chamber of the test handler according to the present invention.

As illustrated in FIG. 18, the test chamber 163 comprises a duct 163b and a matching plate 163c. The duct 163b of a rectangular housing includes an inlet 163a that receives an air flowed from the duct system in the outside of the test chamber. The matching plate 163c equipped in the front side of the duct 163b moves to the forward and the backward direction with the duct 163b by a cylinder.

In the surface of the duct 163b, the number of the air discharging hole 163d is as many as the number of the testable devices. Therefore, when each of penetration holes 163e generated in the matching plate 163c contacts with each of the devices 156 of the test tray 150 while the duct 163b and the matching plate 163c move to the forward direction, the air supplied from the duct 163b is supplied to the devices 156 directly. Therefore, the test chamber according to the present invention can keep the test temperature more efficiently than the conventional test chamber of a simple air circulation structure.

As illustrated in FIG. 9, because the test tray is transferred in vertical state, and the test head 100 is installed in the outside of the handler main body 110, the space occupied by the handler main body 110 in the horizontal docking method of the test head 100 can be occupied by the stocker 120 to arrange the auxiliary suppler and the auxiliary deliverer.

The de-soak chamber 154 receives the test tray supplied from the test chamber 163 after the de-soak chamber 154 re-arranges the test tray 150 to a single row, and the temperature of the devices in the test tray 150 is restored while the test tray 50 is moved to the forward or the backward direction through a predetermined step. For restoring the test temperature to a room temperature, the heater heats up the cooled devices and the external air flowing cools down the heated devices. To perform this, the heater and the fan is equipped in the inside of the de-soak chamber.

Additionally, the main electric or the mechanic units 201 are complicatedly installed in the inside of the test chamber 163 or the de-soak chamber 164. Therefore, the conventional test handler has a difficulty in disassembling and repairing the test head 100 in narrow space.

Figure 17:
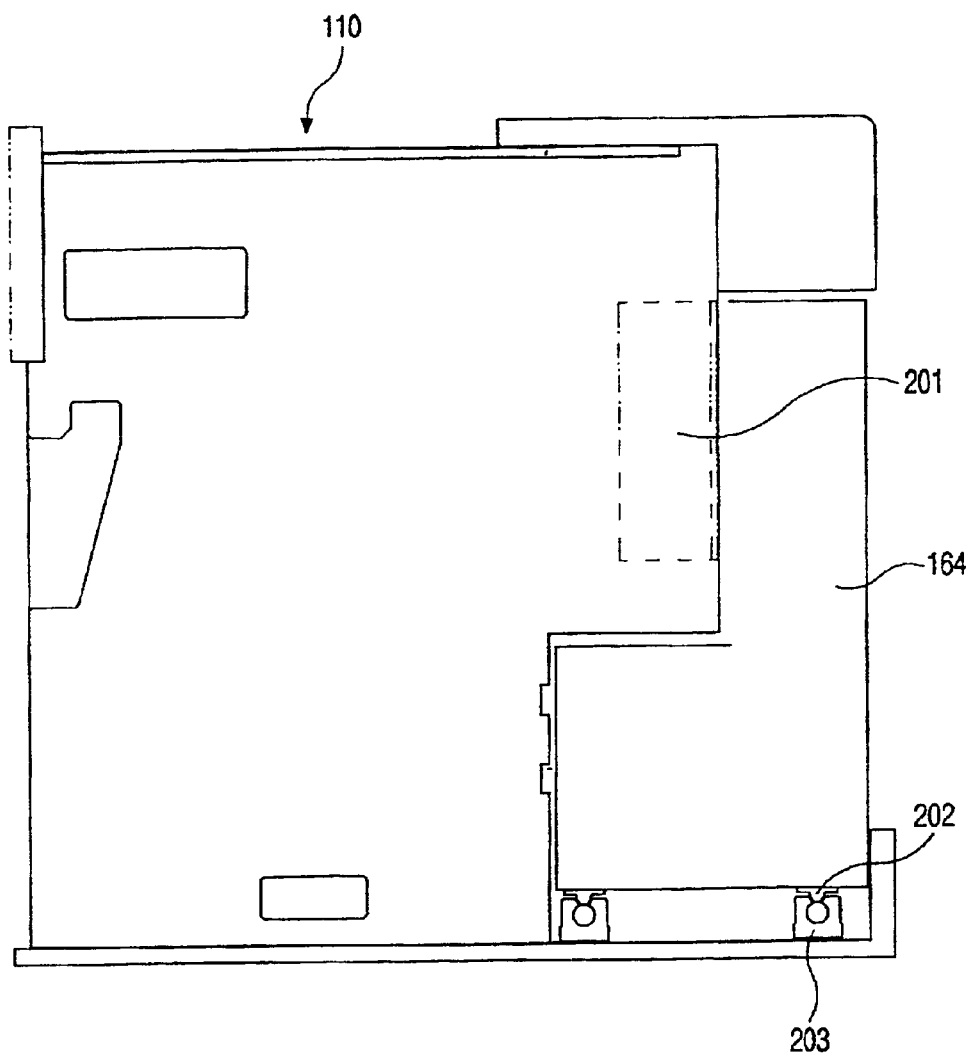
FIG. 17 is a side view illustrating the disassembly structure of a de-soak chamber of the test handler according to the present invention.

However, the test handler according to the present invention, as illustrated in FIG. 17, the de-soak chamber 164 is simply moved to the side of the handler main body 110 to ensure a repairable space for an easy maintenance.

In other words, a linear guide 202 is equipped to the bottom side of the de-soak chamber 164 and a linear block 203 is equipped in the main body 110. Therefore, when troubles to the test handler happen, an operator simply unscrews bolts and equips the linear block 203 to the main body 110 so that the de-soak chamber 164 is extracted to the side of the main body 110 through the linear block 203. Accordingly, the maintenance for the electric or the mechanic units 201 can be easily accomplished to reduce the maintenance time enormously.

On the contrary, the second tray inverter 165 comprising the same constitution of the first tray inverter 161 transfers the test tray 150 in the opposite of the transfer direction of the first tray inverter 161. Therefore, the second tray inverter 165 places again the test tray 150 discharged from the de-soak chamber 164 horizontally, and the horizontal test tray 150 is transferred to the unloading side tray arranging station 166.

The sorter table 167 classifies the devices on the test tray 150 placed in the unloading side tray arranging station 166 in rank and stores the devices. At this time, two robots 172 and 173 accomplish the sorting for a plurality of the devices in the test tray 150 and the transfer from the sorter table 167.

The two robots 172 and 173, as shown in FIG. 9, are installed to move continuously and repeatedly between the unloading side tray arranging station 166 and the sorter table 167. In more, the two robots 172 and 173 pick the devices on the test tray 150 placed in the unloading side tray arranging station 166 to transfer the devices to the sorter table 167 according to the classification of the devices. Therefore, the test-completed device is classified in ranks and stored in unit amount to the sorter table 167.

When a predetermined number of the sorted devices are stored in the sorter table 167 temporarily, an unloading orthogonal robot 174 moving continuously and repeatedly between the sorter table 67 and the unloading side set plate 132 transfers the sorted devices to one of a plurality of empty trays, in designated position, placed in the unloading side set plate 132.

In other words, when the tested devices are unloaded in the present invention, two steps and parts are progressed, one is a sorting part for sorting the devices according to the test results and the other is an unloading part for transferring the sorted devices from the sorter table. Therefore, the device unloading time can be reduced enormously.

When an empty tray placed in the unloading side set plate 132 is filled with the devices, the empty tray is transferred to the tray loader in the user tray deliverer 122 by the transfer arm 140.

Additionally, even though the specific illustration is omitted in the accompanying drawings, the test handler according to the present invention comprises a transfer apparatus and a main controller. The transfer apparatus transfers the test tray 150 to a loader area, a soak chamber, a test chamber, a de-soak chamber and a tray arranging station. The main controller includes a control circuit for controlling drivers and the above described devices.

In more, the test handler according to the present invention, as described in the above statements, also comprises a matching plate 163c for connecting a plurality of the devices received in the test tray 150 moving to the test chamber 163 to sockets on the test head 100, and for supplying a conditional air to the devices 156 directly.

Referring to the accompanying drawings, the functions of the test handler according to the present invention will be explained in more detail.

The user tray supplier 121 placed in the stocker 120 of the handler main body 110 according to the present invention loads a plurality of the user trays 120a containing the testable devices. After the first sensor 141 and the second sensor 142 of the transfer arm 140 recognize how many user trays 120a are loaded in the user tray supplier 121, while operating the test handler, the transfer arm 140 sequentially transfers the user trays 120a to the loading side set plate 131. The test tray 150 is also placed in the loading side tray arranging station 160.

In the above state, the loading orthogonal robot 174 is operated to pick up the devices from the user tray 120a placed in the loading side set plate 131, and to transfer the devices to the test tray 150.

While picking the devices, the hand 180 equipping 16 vacuum pads 187a picks the devices from the user tray 120a, and transfers the devices to the test tray 150. In more, the FR transfer 181 and the LR transfer 184 broaden the interval between the front row 193 and the rear row 194, and the interval of each of the vacuum pads 187a respectively to adjust the device distances so as to fit the interval of the test tray 150, before loading the devices.

In more, the insert 151 is movably combined with the test tray 150, and the site decision unit 153 in the bottom of the test tray 150 raises up to insert the site decision pin 154 to the fixing hole 152 of the insert 151 to fix the insert 151 in the correct position. The guide wall 157, inner tapered in every direction, of the site decision unit 153 also guides the device 156 to load to the insert 151 correctly.

Figure 13:
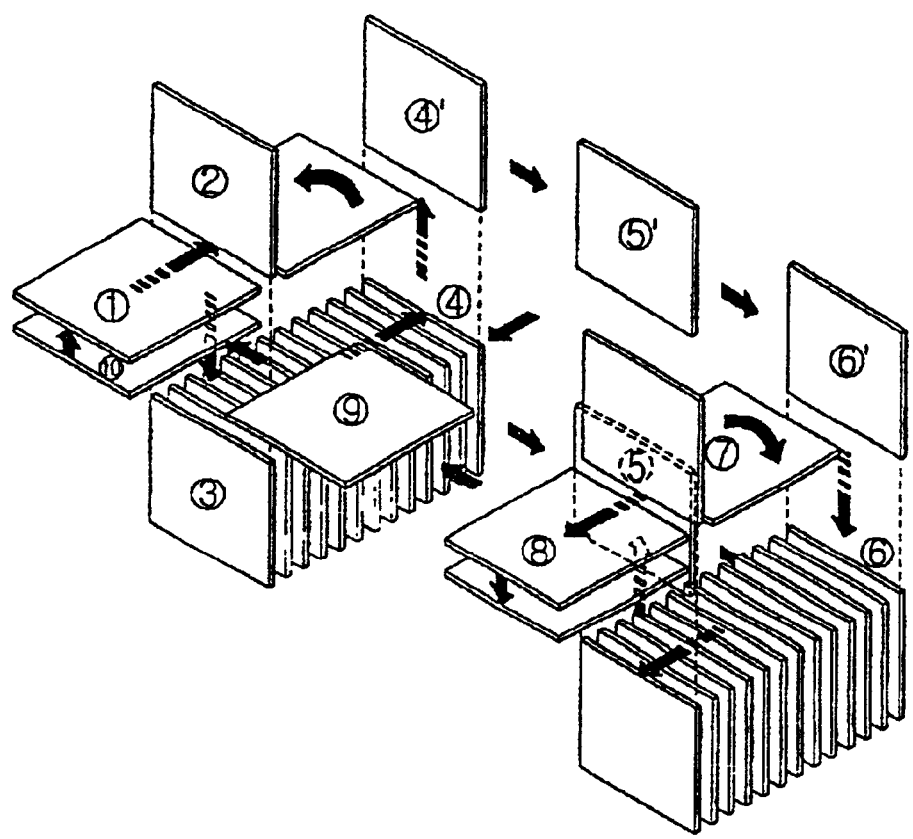
FIG. 13 is an operation flow chart of the test tray illustrating the functions of the test handler according to the present invention.
Figure 14:
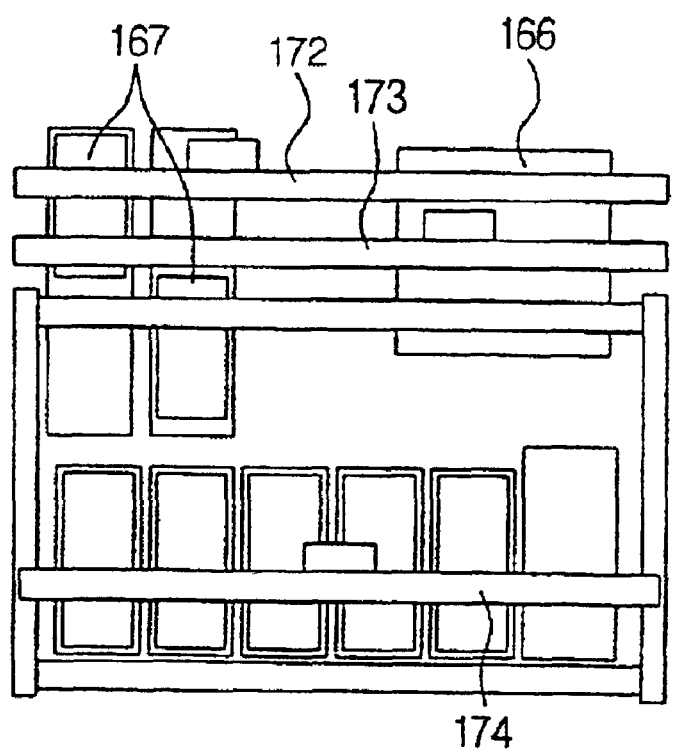
FIG. 14 is a plan view illustrating the unloading functions of the devices in the test handler according to the present invention.

As shown in FIG. 13, when the test tray 150 is filled with the devices (Step 1), the test tray 150 vertically stands up by the first tray inverter, and the test tray 150 is transferred to the soak chamber 162 (Step 2 and Step 3).

The test tray 150 being heated up or cooled down in a predetermined test temperature condition is finally arranged to two vertical rows, top and bottom, and transferred to the test chamber 163 (Step 4).

In the test chamber 163, the tests are accomplished by the way of connecting the 128 devices in the test tray 150 to the test head 100 (Step 5 and Step 5'). The test completed test tray 150 is arranged to a single row and transferred to the de-soak chamber 164 (Step 6 and Step 6').

The test tray 150a discharged from the de-soak chamber 162 by the indexing mechanism 200 and the test tray 150b completing the test in the test chamber 163, are loaded to the guide bar 195 arranged in two vertical rows (top and bottom). While the test tray 150b is loaded, the pusher 198 combined with the transfer axis 196 and the test tray 150a transfers the test tray 150a of the de-soak chamber 162 to the test head 100, and discharges the test completed test tray 150b.

Additionally, two vertical rows of the test tray 150 can be often changed to a single row, one of the top and the bottom row, of the test tray 150 according to the situations of the handler main body 110 to be transferred from the soak chamber 162 to the test chamber 163.

The test tray 150 restoring the room temperature while passing the de-soak chamber 164 is horizontally laid again by the second tray inverter 165 (Step 7), and transferred to the unloading side tray arranging station 166 (Step 8)

Sequentially, the first and the second robots 172 and 173 transfer the devices on the test tray 150 placed in the tray arranging station 166 to the sorter table 167 while the devices are classified in ranks according to the test results.

When the devices are completely transferred, the empty test tray 150 lifts down to be transferred to the loading side tray arranging station 160 through the bottom of the sorter table 167 (Step 9). When a predetermined amount of the sorted devices are stored in the sorter table 167 temporarily, the unloading orthogonal robot 174 transfers the devices sorted in a unit amount, kinds, and classes to the empty test tray placed in the unloading side set plate 132. The empty test tray filled with the devices is finally transferred to the user tray deliverer 122 by the transfer arm 140.

In more, the devices classified as bad chips according to the various test standards are loaded to the multi loader 123 equipping a plurality of the loaders 129 for storing 7 kinds of the user trays 120a. In other words, the motor driver 129a lifts up and down a plurality of the loaders 129 to load the sorted devices to the user tray 120a of the pre-defined loader 129.

However, changing the program by an operator can alter the usage of the loader 129.

Such a procedure is repeated until the inspection for one lot is completed. The present invention transfers the test tray 150 in two vertical rows to the test chamber 163, and the tests are accomplished by the way that 128 devices in the two test trays 150 are simultaneously connected to the test head 100.

Additionally, the unloading procedure of the present invention is performed in two steps, one is the sorting step by the first and the second robots 172 and 173, the other is the loading step by the unloading orthogonal robot 174. Therefore, the device unloading time of the present invention is enormously reduced in comparing with that of the conventional test handler.

In more, the de-soak chamber 164 is separated from the side of the handler main body 110 by utilizing the linear guide 202 in the bottom of the test handler. Therefore, the test handler according to the present invention guarantees the easy maintenance for the electric units 201 and reduces the repair time enormously.

As described in the above statements, the tests according to the present invention are performed by the way that the test tray is arranged in two vertical rows and connected to the test head simultaneously. Therefore, the product yields can be increased because the amount of the devices tested in a unit time can be doubled.

In more, because the test handler according to the present invention has a vertical docking structure to the test head and the test head is placed not inside but outside the test handler to connect to the devices, the space for the test head within the test handler is not necessary. Therefore, the size of the test handler according to the present invention is more compact than that of the conventional test handler. Additionally, because the space for the conventional test head can be employed as a space for the stocker loading the user trays, the auxiliary supplier and the auxiliary deliverer included in the test handler can increase the lot size in a unit operation, and the equipment operation ratio can be maximized.

In more, because the test handler according to the present invention comprises the test head in the outside of the handler main body, the test handler has an advantage in equipment compatibility of combining with various kinds of the test heads by the simple method such as exchanging the change kits.

In more, in the test handler according to the present invention, because the hand of the loading orthogonal robot picks up 16 devices in a unit operation and loads the devices directly to the inside of the insert without pre-sizing operation of the devices, the device loading time can be reduced. Additionally, because two steps, the sorting step and the unloading step, accomplish the unloading procedure of the devices, the devices unloading time can be reduced enormously. Therefore, the amount of the devices treated in a unit time is increased, and the productivity can be improved.

In more, after the test handler according to the present invention completes the test, the discharge of the test completed test tray and the admission of the new test tray are accomplished simultaneously while the test chamber and the matching plate move to the backward direction. Therefore, the indexing time is reduced enormously and the productivity can be improved.

In more, because the test handler according to the present invention separates the de-soak chamber from the side of the test handler by utilizing the linear guide in the bottom of the de-soak chamber for the maintenance, it is easy to repair the inside of the test chamber, and to check the wires in the main body.

In more, the test handler according to the present invention utilizes the multi loader within the test handler to classify easily more than 11 kinds of the devices without any extra equipment.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A test handler for transferring more than one semiconductor device to connect to a test head for testing the semiconductor devices and for classifying the semiconductor devices according to test results, the test handler comprising:

a main body;

a stocker, disposed within the main body, including a user tray supplier for loading a plurality of user trays including the semiconductor devices for the testing, and a user tray deliverer for loading the plurality of user trays carrying classified semiconductor device according to the test results;

a plurality of test trays arranged according to a moving direction for testing the semiconductor devices;

a device loading mechanism for transferring the semiconductor devices in a user tray of the user tray supplier to a test tray;

a first tray inverter for changing a horizontal posture of a test tray carrying the semiconductor devices to a vertical direction;

a soak chamber for preparing a desired test temperature condition while receiving sequentially the test tray postured vertically by the first tray inverter and for transferring the test tray to predetermined steps, and for discharging the test trays arranged in two vertical rows;

a test chamber accomplishing electrical testing of the semiconductor devices in the two test trays discharged from the soak chamber, and for maintaining the test temperature condition;

a de-soak chamber for restoring device temperature while arranging test trays discharged in two rows from the test chamber to a single row;

a second tray inverter for inverting a test tray discharged in the vertical posture from the de-soak chamber to a horizontal posture; and a device unloading means capable of transferring the semiconductor devices on the test tray postured horizontally by the second tray inverter to multiple empty user trays after classifying the semiconductor devices according to the test results.

2. The test handler according to claim 1, wherein the stocker comprises a multi loader for classifying and storing the plurality of user trays.

3. The test handler according to claim 2, wherein the multi loader comprises:

a motor;

a ball screw rotated by the motor; and a plurality of loader blocks capable of being lifted up and down by the ball screw and capable of being loaded with the classified user trays.

4. The test handler according to claim 3, wherein the multi loader comprises:

a discharge cylinder for discharging loader blocks to the outside of the test handler; and a transfer guide for guiding the discharge of the loader blocks to an outside of the test handler by driving of the discharge cylinder.

5. The test handler according to claim 1, wherein the stocker performs the supply and the delivery of the user trays during operation, the stocker comprising:

an auxiliary supplier equipped in a bottom side of the user tray supplier for loading user trays to the user tray supplier when the user tray supplier completes loading user trays within the user tray supplier; and an auxiliary deliverer equipped in the bottom side of the user tray deliverer and capable of transferring a user tray of the user tray deliverer when the user tray is loaded to the user tray deliverer.

6. The test handler according to claim 1, wherein the device loading means comprises:

several loading side set plates arranged in an upper side of the user tray supplier and including user tray for loading the devices;

a transfer arm for transferring sequentially a user tray from the user tray supplier to the loading side set plate, and a loading orthogonal robot moving sequentially and repeatedly between a loading side set plate and a loading side tray arranging station placing a test tray, and transferring a semiconductor device on a user tray to a test tray.

7. The test handler according to claim 6, wherein the device loading means further comprises:

a site decision pin, inserted into a fixing hole equipped movably to the test tray, for fixing the insert to the test tray; and a site decision unit including the site decision pin comprising a guide wall, inner-tapered to guide the device to the insert.

8. The test handler according to claim 6, wherein the transfer arm comprises a first sensor and a second sensor installed in an upper side of the transfer arm, and moves at a predetermined speed until the first sensor detects a position of a user tray, and moves slower than a predetermined speed for the second sensor to detect the user tray when the first sensor detects the position of the user tray.

9. The test handler according to claim 6, the loading orthogonal robot comprising:

a front row and a rear row equipping eight vacuum pads respectively to pick up sixteen devices in unit operation;

a hand adjusting an interval between each of the vacuum pads; and a transfer means driving the hand.

10. The test handler according to claim 9, wherein the transfer means comprises:

a front and rear transfer mechanism for shifting the front row and the rear row in a forward or backward direction to adjust an interval between the front row and the rear row; and a left and right transfer mechanism for lifting up and down the vacuum pads to adjust an interval of each of the vacuum pads respectively.

11. The test handler according to claim 10, wherein the left and right transfer mechanism comprises:

a cam plate including a long hole to fit with a horizontal distance such that each of the vacuum pads moves respectively; and a cam follower in each of the vacuum pads inserted into the long hole of the cam plate to adjust an interval of the vacuum pads, when the cam plate lifts up and down.

12. The test handler according to claim 1, wherein the soak chamber comprises:

a guide bar loading test trays of two vertical rows, top and bottom; and a pusher transferring test trays of two vertical rows loaded in the guide bar to a test position or a discharge position selectively.

13. The test handler according to claim 1, wherein the test head is placed at an outside of the main body.

14. The test handler according to claim 13, wherein the test chamber comprises:
- an air inlet receiving air from the outside of the test chamber;
- a plurality of discharge holes discharging the received air from the air inlet to a side of the test chamber; and
- a matching plate comprising multiple penetration holes, generated in the side of the test chamber including the discharge holes, for supplying the discharged air from the discharge holes to devices of the test tray.

15. The test handler according to claim 1, wherein a linear guide is equipped in a bottom side of the de-soak chamber and a linear block is equipped in the main body so that the de-soak chamber can be extracted to an outside of the main body with the linear guide.

16. The test handler according to claim 1, wherein the device unloading means comprises:
- first and second robots transferring a devices on the test tray placed in an unloading side tray arranging station, after classifying the devices according to the test results;
- at least three sorter tables for storing the devices transferred by the first and second robots, according to a unit amount and a decided class of the devices;
- an unloading side orthogonal robot for transferring devices stored in sorter tables to a predetermined position, according to a unit amount and a decided class of the devices;
- a plurality of unloading side set plates, arranged in an upper side of the user tray deliverer, including a plurality of empty user trays for receiving the devices transferred by the unloading side orthogonal robot; and
- a transfer arm transferring the empty user trays to the user tray deliverer when the empty user trays placed in the unloading side set plate are filled with a predetermined amount of the devices.

17. The test handler according to claim 1, wherein the first tray and the second tray inverter comprise respectively:
- an inverting plate including an insert hole in a middle part for the test tray to be admitted;
- a lifting cylinder combined with an end of a side of the inverting plate;
- a bracket, protruded from a bottom side of the inverting plate, including a long hole; and
- a front/rear cylinder including a supporting axis combined with the end side of the bracket to push the inverting plate to a forward direction.

18. The test handler according to claim 17, wherein the inside of the insert hole comprises:
- a locking pin locking the test tray inserted in the insert hole; and
- a locking cylinder operating the locking pin.

19. The test handler according to claim 1, wherein the device unloading means comprises:
- a sorting part for sorting devices according to the test results; and
- an unloading part for unloading the sorted devices from the sorting part.

* * * * *